US011671062B2

(12) United States Patent
Berkhout et al.

(10) Patent No.: US 11,671,062 B2
(45) Date of Patent: Jun. 6, 2023

(54) SENSE AMPLIFIER CIRCUIT

(71) Applicant: NXP B.V., Eindhoven (NL)

(72) Inventors: Marco Berkhout, Tiel (NL); Quino Sandifort, Elst gld (NL); Gayatri Agarwal, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/392,508

(22) Filed: Aug. 3, 2021

(65) Prior Publication Data

US 2022/0069782 A1   Mar. 3, 2022

(30) Foreign Application Priority Data

Aug. 27, 2020   (EP) .................................... 20193019

(51) Int. Cl.
*H03F 3/217*   (2006.01)
*H03F 3/185*   (2006.01)

(52) U.S. Cl.
CPC .......... *H03F 3/2171* (2013.01); *H03F 3/185* (2013.01); *H03F 2200/03* (2013.01)

(58) Field of Classification Search
CPC .... H03F 3/2171; H03F 3/185; H03F 2200/03; H03F 2200/351; H03F 2200/393;
(Continued)

(56) References Cited

U.S. PATENT DOCUMENTS 7,157,968 B2 *   1/2007   Shin ........................ H03F 1/523
                                                          330/251
8,378,745 B2   2/2013   Dooper
(Continued)

OTHER PUBLICATIONS

Berkhout, M., "Integrated overcurrent protection system for class-D audio power amplifiers", IEEE Journal of Solid-State Circuits, vol. 40, Issue 11, Nov. 2005.
Berkhout, M., "A 4Ω2.65W Class-D Audio Amplifier With Embedded DC-DC Boost Converter, Current Sensing ADC and DSP for Adaptive Speaker Protection", IEEE Journal of Solid-State Circuits, vol. 48, Issue 12, Dec. 2013.
(Continued)

*Primary Examiner* — Hieu P Nguyen

(57) ABSTRACT

A sense amplifier circuit comprising a first-, second-, third- and fourth-amplification-blocks, each amplification-block comprising: an amplification-block-transistor comprising and an amplification-block-resistor. The amplification-block-transistor includes: a first-conduction-channel-terminal, a second-conduction-channel-terminal that is connected to an amplification-block-output-node, and a control-terminal that is connected to an amplification-block-control-node. The sense amplifier circuit also comprises: an amplification-block-resistor connected in series between an amplification-block-input-node and the first-conduction-channel-terminal; a first-bias-voltage-source connected to the amplification-block-control-nodes of the first- and third-amplification-blocks, a second-bias-voltage-source connected to the amplification-block-control-nodes of the second- and fourth-amplification-blocks. The sense amplifier circuit also comprises: a first-common-mode-voltage-resistor connected in series between a first-sensed-output-terminal and a common-mode-voltage-node; and a second-common-mode-voltage-resistor connected in series between a second-sensed-output-terminal and the common-mode-voltage-node.

19 Claims, 12 Drawing Sheets

(58) Field of Classification Search
CPC ......... H03F 2200/456; H03F 2200/462; H03F 2200/481; H03F 1/523; H03F 3/2173; H03F 3/183; H03F 1/3205; H04R 29/001; H04R 3/007; H04R 3/00
USPC ........................................ 330/10, 207 A, 251
See application file for complete search history.

(56) References Cited

U.S. PATENT DOCUMENTS

| | | | |
|---|---|---|---|
| 8,963,634 | B2 | 2/2015 | Srivastava et al. |
| 10,018,658 | B2 | 7/2018 | Botti et al. |
| 10,554,185 | B2 * | 2/2020 | Høyerby ................. H03F 1/523 |
| 2016/0065134 | A1 | 3/2016 | Lu et al. |
| 2016/0182998 | A1 | 6/2016 | Galal et al. |
| 2018/0014119 | A1 | 1/2018 | Chawla |

OTHER PUBLICATIONS

Binet, V., "A fully Integrated Class-D Amplifier in 40nm CMOS with Dynamic Cascode Bias and Load Current Sensing", ESSCIRC 2014—40th European Solid State Circuits Conference, Nov. 3, 2014.

Cadete, F., "Overcurrent detection circuit for integrated class-D amplifiers", IEEE 2011 20th European Conference on Circuit Theory 2nd Design, (ECCTD), Aug. 2011.

Guo, L., "Overcurrent Detection Circuit for Integrated Class-D Amplifiers", IEEE Transactions on Circuits and Systems II: Express Briefs, vol. 62, No. 10, Oct. 2005.

Schinkel, D., "A Multiphase Class-D Automotive Audio Amplifier With Integrated Low-Latency ADCs for Digitized Feedback After the Output Filter", IEEE Journal of Solid-State Circuits, vol. 52, No. 12, Dec. 2017.

* cited by examiner

SENSE AMPLIFIER CIRCUIT

CROSS-REFERENCE TO RELATED APPLICATIONS

This application claims the priority under 35 U.S.C. § 119 of European Patent application no. 20193019.5, filed on 27 Aug. 2020, the contents of which are incorporated by reference herein.

The present disclosure relates to load sense amplifier circuits and output stages that use such sense amplifier circuits.

SUMMARY

According to a first aspect of the present disclosure there is provided a sense amplifier circuit comprising:
a first-sensed-output-terminal;
a second-sensed-output-terminal;
a first-input-voltage-terminal;
a second-input-voltage-terminal;
a third-input-voltage-terminal;
a fourth-input-voltage-terminal;
a common-mode-voltage-node;
first-, second-, third- and fourth-amplification-blocks, each amplification-block comprising:
    an amplification-block-input-node,
    an amplification-block-output-node,
    an amplification-block-control-node,
    an amplification-block-transistor comprising:
a first-conduction-channel-terminal,
a second-conduction-channel-terminal that is connected to the amplification-block-output-node, and
a control-terminal that is connected to the amplification-block-control-node;
an amplification-block-resistor connected in series between the amplification-block-input-node and the first-conduction-channel-terminal,
a first-bias-voltage-source connected to the amplification-block-control-nodes of the first- and third-amplification-blocks;
a second-bias-voltage-source connected to the amplification-block-control-nodes of the second- and fourth-amplification-blocks;
a first-common-mode-voltage-resistor connected in series between the first-sensed-output-terminal and the common-mode-voltage-node; and
a second-common-mode-voltage-resistor connected in series between the second-sensed-output-terminal and the common-mode-voltage-node,
wherein:
the amplification-block-output-nodes of the first- and second-amplification-blocks are connected to the first-sensed-output-terminal;
the amplification-block-output-nodes of the third- and fourth-amplification-blocks are connected to the second-sensed-output-terminal;
the amplification-block-input-node of the first-amplification-block is connected to the first-input-voltage-terminal;
the amplification-block-input-node of the second-amplification-block is connected to the second-input-voltage-terminal;
the amplification-block-input-node of the third-amplification-block is connected to the third-input-voltage-terminal; and
the amplification-block-input-node of the fourth-amplification-block is connected to the fourth-input-voltage-terminal.

Such a sense amplifier circuit can combine four-quadrant signals that are received at the four input-voltage-terminals into a single differential voltage signal. This may simplify and improve the accuracy of current sensing measurements in an output stage such as a class-D output stage.

In one or more embodiments each amplification-block-transistor is a bipolar-junction-transistor, BJT, or a field-effect-transistor, FET.

In one or more embodiments the transistors of the first- and third-amplification-blocks are p-type metal-oxide-semiconductor FETs, MOSFETs. The transistors of the second- and fourth-amplification-blocks may be n-type MOSFETs.

In one or more embodiments the sense amplifier circuit comprises a first-reference-voltage-terminal connected to the first-bias-voltage-source, and a second-reference-voltage-terminal connected to the second-bias-voltage-source.

In one or more embodiments each amplification-block comprises a connection-node connected in series between the amplification-block-resistor and the first-conduction-channel-terminal. Each amplification-block may also comprise an amplifier comprising: an amplifier-first-input-terminal; an amplifier-second-input-terminal; and an amplifier-output-terminal. The amplifier-first-input-terminal may be connected to the amplification-block-control-node. The amplifier-second-input-terminal may be connected to the connection-node. The amplifier-output-terminal may be connected to the control-terminal. In this way, the control-terminal may be connected to the amplification-block-control-node via the amplifier.

In one or more embodiments the first and third-amplification-blocks comprise an amplification-block-cascode-control-node. The first and third-amplification-blocks may also comprise a cascode connected in series between the second-conduction-channel-terminal and the amplification-block-output-node. The cascode may comprise a cascode-transistor comprising: a cascode-transistor-first-conduction-channel-terminal connected to the second-conduction-channel-terminal, a cascode-transistor-second-conduction-channel-terminal connected to the amplification-block-output-node, and a cascode-transistor-control-terminal connected to the amplification-block-cascode-control-node. The first and third-amplification-blocks may also comprise a cascode-diode comprising: a cascode-diode-anode connected to the cascode-transistor-second-conduction-channel-terminal, and a cascode-diode-cathode connected to the cascode-transistor-first-conduction-channel-terminal.

In one or more embodiments the sense amplifier circuit comprises a third-bias-voltage-source connected to the amplification-block-cascode-control-node of the first- and third-amplification-blocks.

In one or more embodiments each cascode-transistor is a p-type MOSFET.

In one or more embodiments the third-bias-voltage-source is connected to the first-reference-voltage-terminal.

In one or more embodiments the second-bias-voltage-source comprises: a second-bias-voltage-source-output-node connected to the amplification-block-control-nodes of the second- and fourth-amplification-blocks. The second-bias-voltage-source may also comprise a third-bias-voltage-source and/or a fifth-amplifier. The fifth-amplifier may comprise: an amplifier-first-input-terminal connected to the common-mode-voltage-node; an amplifier-second-inputterminal connected to the third-bias-voltage-source; and an amplifier-output-terminal connected to the second-bias-voltage-source-output-node.

There is also provided an output stage comprising:
any sense amplifier circuit disclosed herein, an output-stage-first-reference-voltage-terminal;
an output-stage-second-reference-voltage-terminal;
an output-stage-first-output-voltage-terminal;
an output-stage-second-output-voltage-terminal;
a first-output-device-terminal;
a second-output-device-terminal;
a first-low-pass-circuit connected in series between the first-output-device-terminal and the output-stage-first-output-voltage-terminal;
a second-low-pass-circuit connected in series between the second-output-device-terminal and the output-stage-second-output-voltage-terminal;
first-, second-, third- and fourth-output-stage-amplification-blocks, each output-stage-amplification-block comprising:
an output-stage-amplification-block-input-node,
an output-stage-amplification-block-output-node,
an output-stage-amplification-block-control-terminal,
an output-stage-amplification-block-sense-terminal,
a first-output-stage-transistor comprising:
a first-output-stage-transistor-first-terminal connected to the output-stage-amplification-block-input-node,
a first-output-stage-transistor-second-terminal connected to the output-stage-amplification-block-output-node, and
a first-output-stage-transistor-control-terminal connected to the output-stage-amplification-block-control-terminal,
a first-output-stage-diode comprising:
a first-output-stage-diode-anode connected to the first-output-stage-transistor-second-terminal, and
a first-output-stage-diode-cathode connected to the first-output-stage-transistor-first-terminal,
a second-output-stage-transistor connected in parallel with the first-output-stage-transistor between the output-stage-amplification-block-input-node and the output-stage-amplification-block-output-node, the second-output-stage-transistor comprising:
a second-output-stage-transistor-first-terminal connected to the output-stage-amplification-block-input-node,
a second-output-stage-transistor-second-terminal connected to the output-stage-amplification-block-output-node, and
a second-output-stage-transistor-control-terminal connected to the output-stage-amplification-block-control-terminal,
a second-output-stage-diode comprising:
a second-output-stage-diode-anode connected to the second-output-stage-transistor-second-terminal, and
a second-output-stage-diode-cathode connected to the second-output-stage-transistor-first-terminal,
a sense-resistor connected between:
the output-stage-amplification-block-input-node and the second-output-stage-transistor-first-terminal, or
between the output-stage-amplification-block-output-node and the second-output-stage-transistor-second-terminal, and
a sense-node in series between the sense-resistor and the second-output-stage-transistor and connected to the output-stage-amplification-block-sense-terminal; and
wherein:
the output-stage-amplification-block-input-nodes of the first- and third-output-stage-amplification-blocks are connected to the output-stage-first-reference-voltage-terminal;
the output-stage-amplification-block-output-nodes of the second- and fourth-output-stage-amplification-blocks are connected to the output-stage-second-reference-voltage-terminal;
the output-stage-amplification-block-output-node of the first-output-stage-amplification-block and the output-stage-amplification-block-input-node of the second-output-stage-amplification-block are connected to the output-stage-first-output-voltage-terminal;
the output-stage-amplification-block-output-node of the third-output-stage-amplification-block and the output-stage-amplification-block-input-node of the fourth-output-stage-amplification-block are connected to the output-stage-second-output-voltage-terminal;
the first-input-voltage-terminal is connected to the output-stage-amplification-block-sense-terminal of the first-output-stage-amplification-block;
the second-input-voltage-terminal is connected to the output-stage-amplification-block-sense-terminal of the second-output-stage-amplification-block;
the third-input-voltage-terminal is connected to the output-stage-amplification-block-sense-terminal of the third-output-stage-amplification-block; and
the fourth-input-voltage-terminal is connected to the output-stage-amplification-block-sense-terminal of the fourth-output-stage-amplification-block.

In one or more embodiments the output stage comprises a loudspeaker connected to the first- and second-output-device-terminals.

In one or more embodiments the first-low-pass-filter and the second-low-pass-filter comprise an inductor-capacitor, LC, circuit.

In one or more embodiments each first-output-stage-transistor and each second-output-stage-transistor is a field-effect-transistor, FET.

In one or more embodiments:
the first-output-stage-diodes are body diodes of their associated first-output-stage-transistors, and/or
the second-output-stage-diodes are body diodes of their associated second-output-stage-transistors.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which:

FIG. 10b shows further features of the sense amplifier circuit of FIG. 10a;
and
FIG. 10c shows further features of the sense amplifier circuit of FIG. 10a.

DETAILED DESCRIPTION

Class-D audio amplifiers are widely applied for driving loudspeakers in consumer, mobile and automotive (e.g., car) audio systems.

Figure 1:
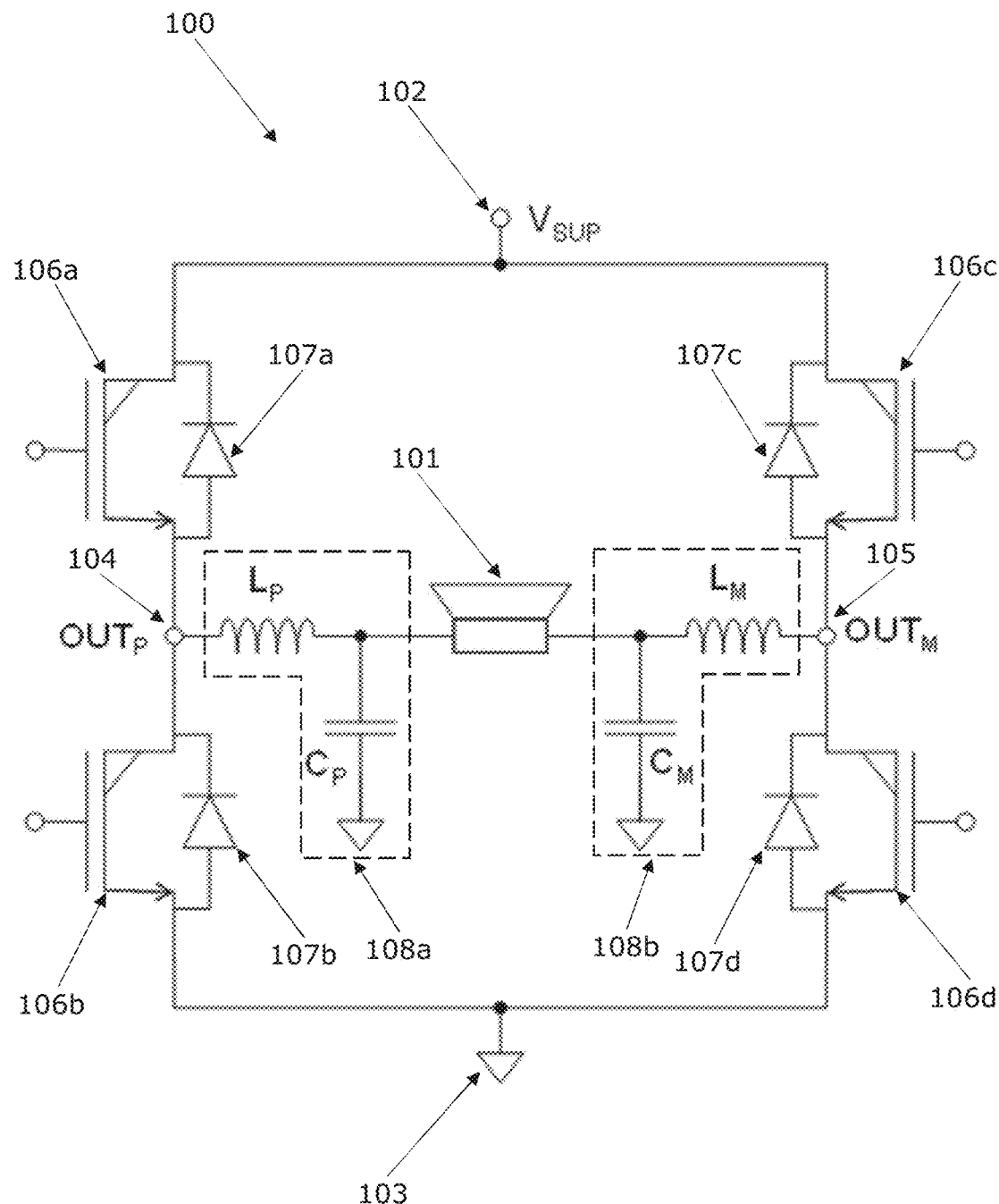
FIG. 1 shows an example output stage.

FIG. 1 shows an example output stage 100 that corresponds to a class-D output stage found in car audio systems. The output stage 100 comprises a loudspeaker 101, first- and second-reference-voltage-terminals 102, 103 ($V_{SUP}$ and ground respectively), first- and second-output-voltage terminals 104, 105 ($OUT_p$ and $OUT_m$ respectively), first-, second-, third- and fourth-low-ohmic-powerFETs 106a-d, first-, second-, third- and fourth-diodes 107a-d, and first- and second-external-inductor-capacitor-filters (first- and second-external-LC-filters) 108a,b.

The output stage 100 has a so-called Bridge-Tied-Load (BTL) configuration where both sides of the loudspeaker 101 are driven in opposite phase. The first- and second-output-nodes 104, 105 are alternatingly switched between the first-reference-voltage-terminal 102 and the second-reference-voltage-terminal 103 by the four low-ohmic-powerFETs 106a-d. This yields two square-wave signals with a fundamental frequency that typically lies around 500 kHz. Usually, some form of pulse-width modulation (PWM) is used such that the average value of a voltage signal at the first-output-voltage-terminal 104 minus a voltage signal at the second-output-voltage-terminal 105 corresponds to the desired audio signal.

The loudspeaker 101 is connected to the first- and second-output-terminals 104, 105 with the first- and second-external-LC-filters 108a,b. These filters suppress high-frequency components of the square-wave signals and only allow audio frequency components to pass.

The purpose of an audio amplifier, such as the output stage shown in FIG. 1, is to force a voltage across a loudspeaker that reproduces an audio input signal with high fidelity. This means that the audio amplifier should not distort the audio input signal. Low distortion is in general achieved by applying feedback. A proper feedback loop has high loop gain in the audio frequency range that suppresses nonlinearity of the output stage and, optionally, the first- and second-external-LC-filters.

Since the audio amplifier forces the voltage across the loudspeaker, the current delivered by the audio amplifier is determined by the loudspeaker impedance. There are many applications where it is necessary to measure or sense this current (the load current) with different requirements on the accuracy:

1. Protection. In case of a short-circuit from one of the loudspeaker cables to ground, supply or the other loudspeaker cable, the current can reach excessive levels. In this case the audio amplifier needs to shut down to prevent damage. The required accuracy of the current measurement is in this case not very high, e.g. 10% is usually good enough.

2. Diagnostics. In the automotive domain it is required to determine if a loudspeaker is connected and what the loudspeaker impedance is. This is typically done during the start-up phase of the audio amplifier but developments in the automotive industry are moving towards systems where the presence of a loudspeaker needs to be monitored continuously for reasons of safety. These applications require moderate accuracy, e.g. around 40 dB.

3. Speaker Protection. The loudspeaker current can be used to determine the temperature of the loudspeaker and estimate the excursion of the loudspeaker membrane. This information can be used to prevent the loudspeaker from being damaged. This requires a linearity of around 60 dB.

4. Speaker linearization. When the loudspeaker current can be measured with enough accuracy it becomes feasible to use that information to linearize the acoustic behaviour of the loudspeaker itself. For such applications linearity much higher than 60 dB is required.

The following examples may be directed to one or more of the above applications.

Figure 2:
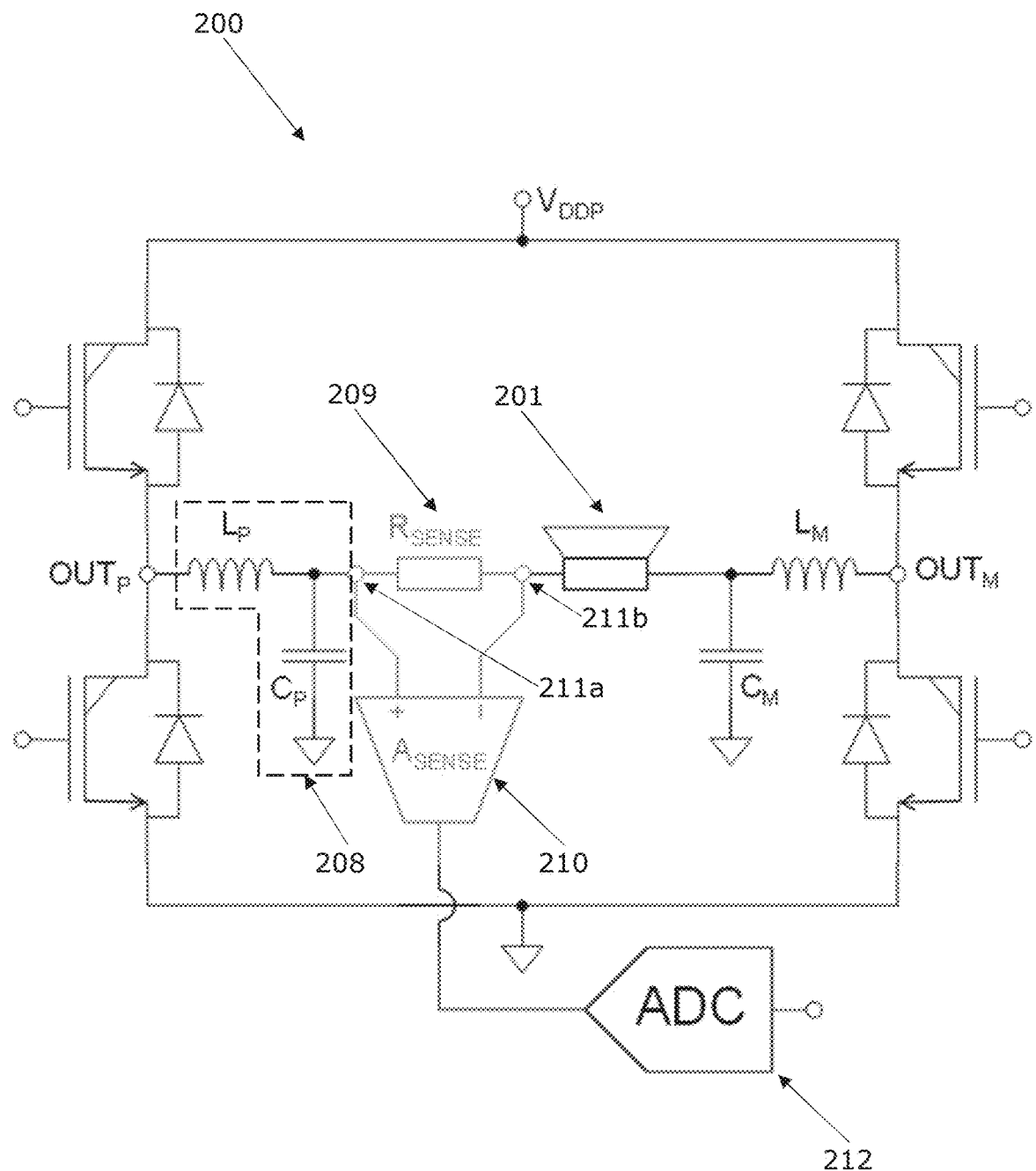
FIG. 2 shows a further example of an output stage.

FIG. 2 shows an example of an output stage 200 configured for current sensing. The output stage 200 is similar to the output stage of FIG. 1 in that it comprises a loudspeaker 201 and a first-external-LC-filter 208. Differences over the output stage of FIG. 1 include a sense-resistor, $R_{SENSE}$, 209 connected in series between the loudspeaker 201 and the first-external-LC-filter 208, a sense-amplifier, $A_{SENSE}$, 210 configured to sense a voltage across the sense-resistor 209 (as shown, using pins 211a, 211b) and output an amplified voltage, and an analogue-to-digital converter, ADC, 212 connected to the sense-amplifier 210 such that it can receive the amplified voltage.

The output stage 200 of FIG. 2 may be considered to represent a straightforward and accurate configuration for current sensing. This is because the sense-resistor 209 is directly in series with the loudspeaker 201. In turn, a voltage across the sense-resistor 209 is sensed and amplified by the sense-amplifier 210 and then fed to the ADC 212. For accurate current sensing, the sense-amplifier 210 needs to have a very high common-mode rejection since the differential signal across the sense-resistor 209 is small, e.g. 50 mV, whereas the signal swing at the loudspeaker 201 is much bigger, e.g. 25V.

Figure 3:
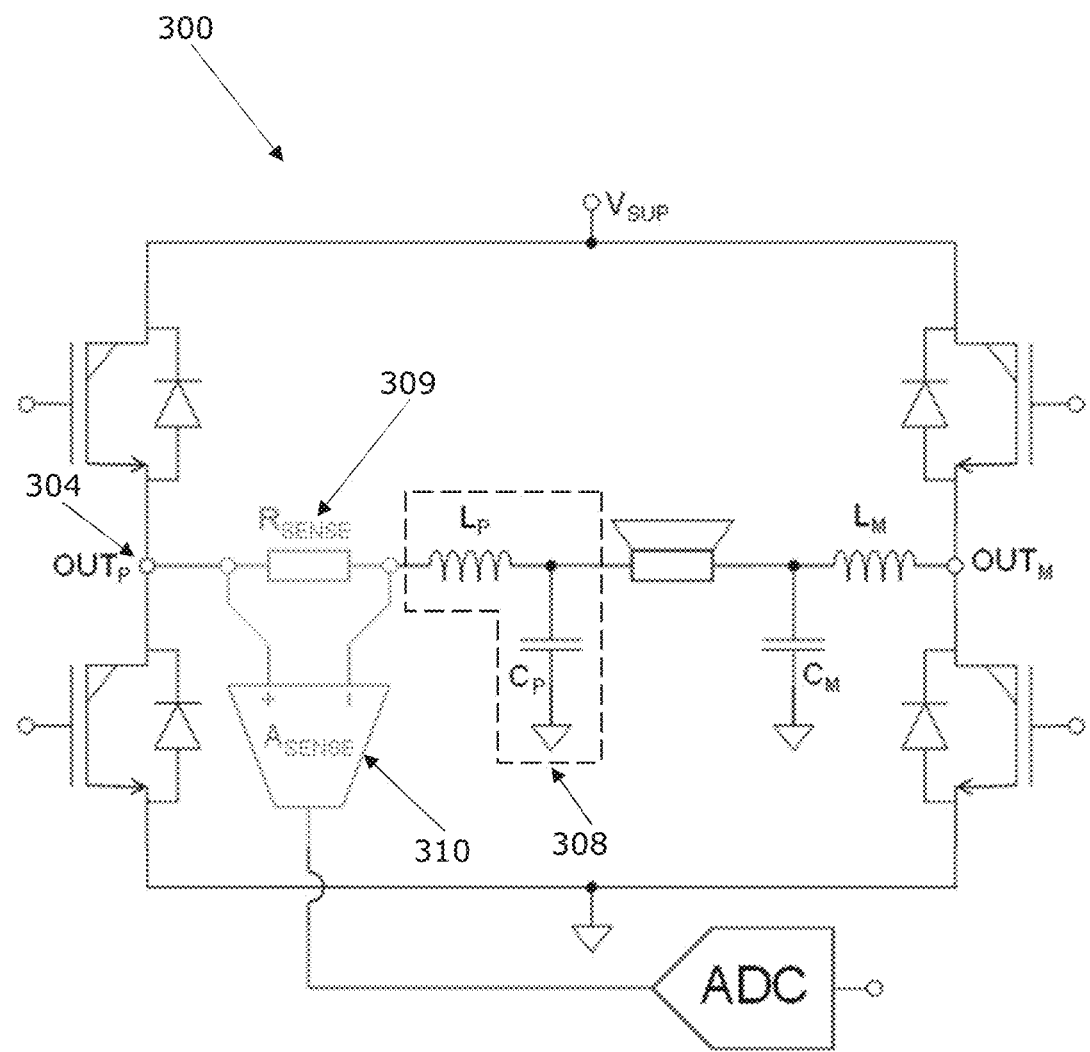
FIG. 3 shows a further example of an output stage.

FIG. 3 shows a further example of an output stage 300 configured for current sensing that is similar to the output stages of FIGS. 1 and 2. In particular, the output-stage 300 comprises an first-output-voltage-terminal 304 ($OUT_p$), an first-external-LC-filter 308, a sense-resistor 309, and a sense-amplifier 310. A difference over the output stage of FIG. 2 is that the sense-resistor 309 is placed upstream of the first-external-LC-filter 308 such that it is connected in series between the first-external-LC-filter 308 and the first-output-voltage-terminal 304. In principle, this configuration can be realized with without the need of additional pins. However, the implementation of the sense-amplifier 310 will be more challenging than in case shown in FIG. 2 since now the common-mode voltage is the unfiltered switching output voltage, which is a PWM square-wave, instead of an audio signal. Furthermore, the current through the sense-resistor 309 is now the sum of the load current and the current through the capacitor C in the first-external-LC-filter 308.

Figure 4:
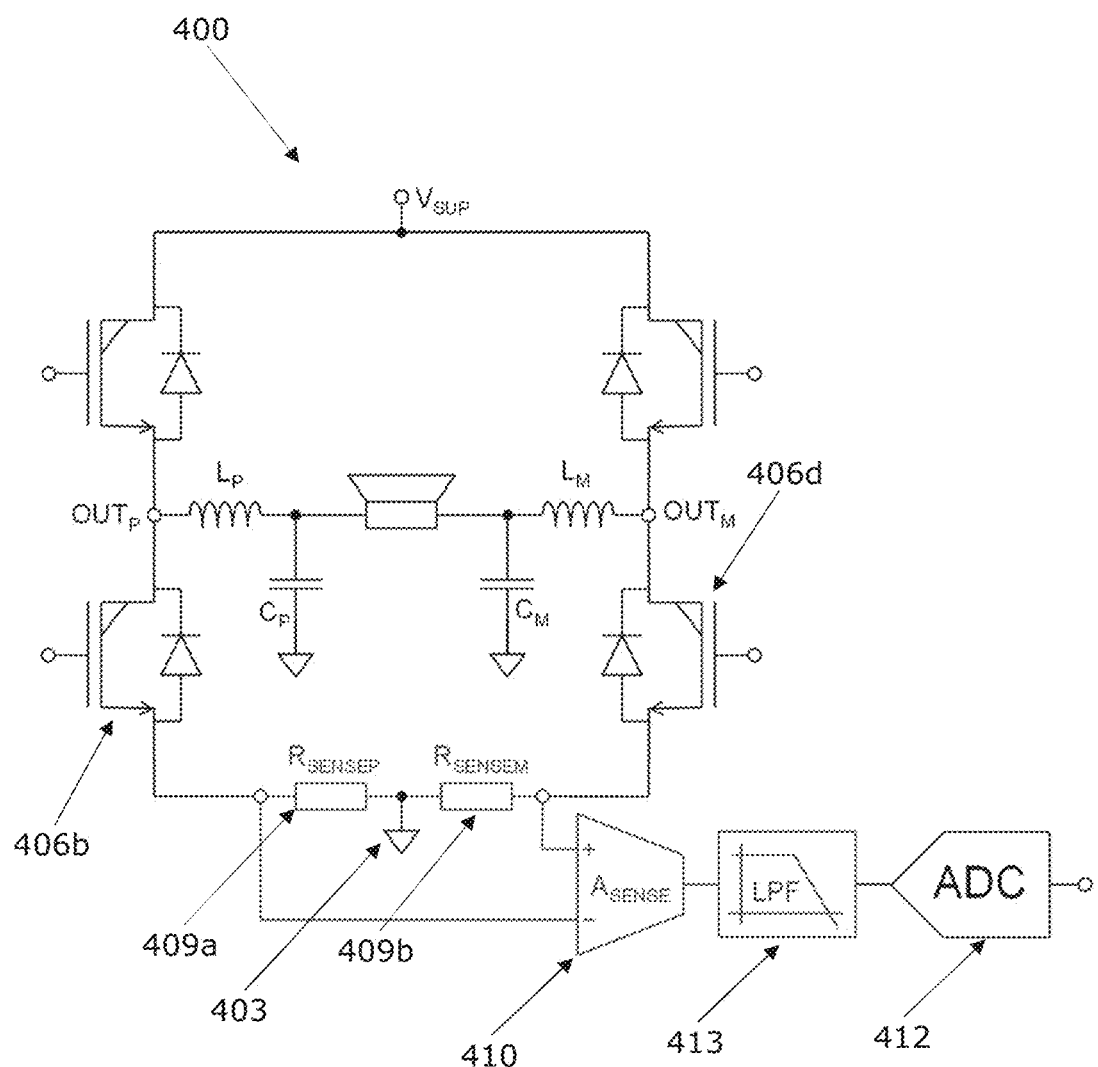
FIG. 4 shows a further example of an output stage.

FIG. 4 shows a further example of an output stage 400 configured for current sensing. The output stage 400 comprises first- and second-low-side powerFETs 406*b*, 406*d*, a second-reference-voltage-terminal 403 (ground in this example), first- and second-sense-resistors 409*a*, 409*b*, a sense-amplifier 410, an analogue-to-digital converter, ADC, 412 and a low-pass filter (LPF) 413. Compared with the example output stages of FIGS. 2 and 3, the output stage 400 of FIG. 4 represents an alternative configuration in which the first- and second-sense-resistors 409*a*, 409*b* are connected in series between the low-side powerFETs 406*b*, 406*d* and the second-reference-voltage-terminal 403. In this configuration, the common-mode rejection requirement of the sense-amplifier 410 can be relaxed because one terminal of each sense-resistor 409*a*, 409*b* is connected to the reference-voltage-terminal 403 (i.e., one terminal of each sense-resistor is grounded). In addition, the load and capacitor currents only flow through a given sense-resistor when a corresponding low-side powerFET is on (e.g., the sense-resistor 409*a* and the low-side powerFET 406*b* that are to the left of the second-reference-voltage-terminal 403). This means that the voltage signal going from the sense-amplifier 410 to the ADC 412 is mixed with the PWM signal which yields high frequency components. These high frequency components can be suppressed with the LPF 413.

Figure 5:
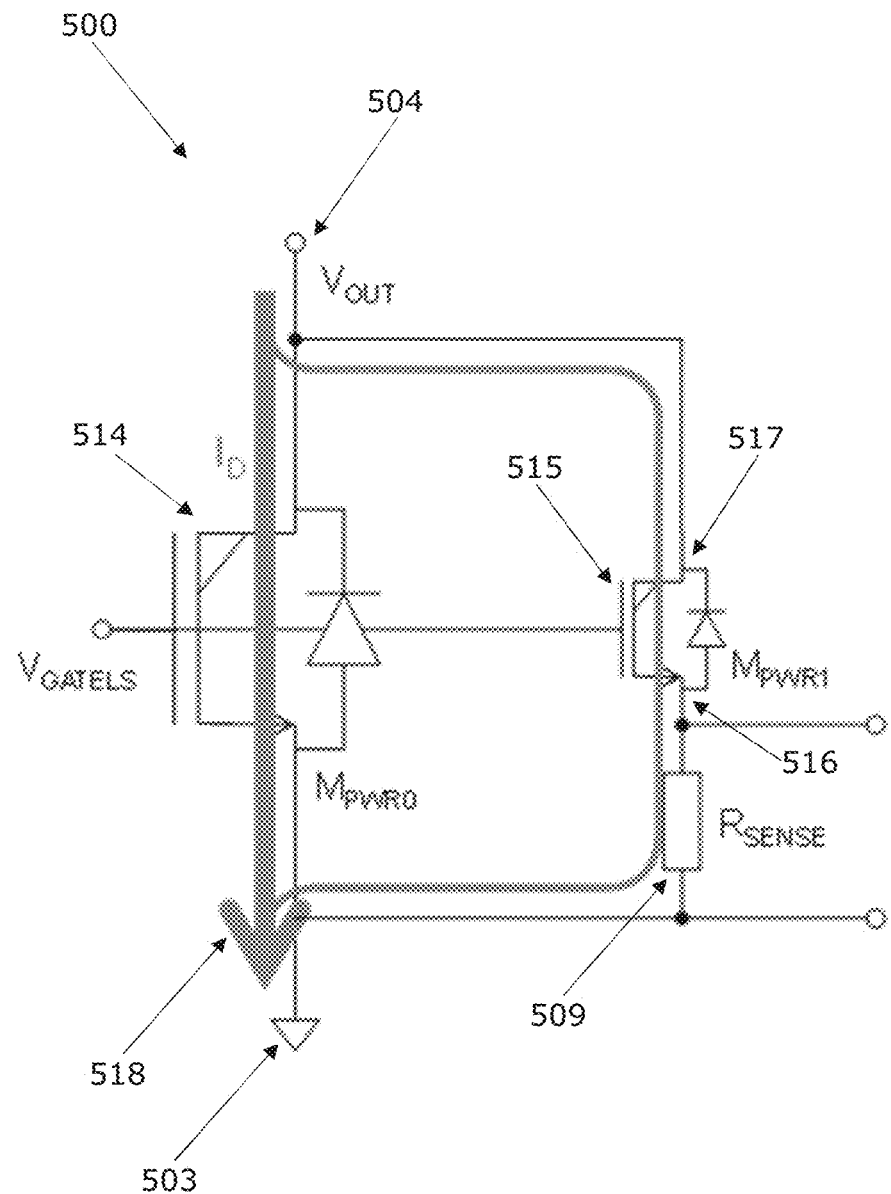
FIG. 5 shows an example circuit.

The output stage of FIG. 4 can be used in smart-speaker drivers in mobile applications, can be integrated without any external components or additional pins, and has only moderate requirements on the sense-amplifier 410. For example, in smart-speaker drivers the output power levels are modest, e.g. less than 5 W, which makes it feasible to place the sense-resistors in series with the low-side powerFETs that support all of the output current. However, in high-power automotive (and consumer) amplifiers the output-stage of FIG. 4 may be unsuitable since the powerFETs are typically connected with several bondwires that are distributed along the perimeter of the powerFETs to make the current density as uniform as possible. In these cases it is impractical to route all current through a single sense resistor. FIG. 5 shows an example circuit 500 that, in general terms, is configured for sensing not all current but only a fraction. The circuit 500 comprises an output-voltage terminal 504, a reference-voltage terminal (ground in this example) 503, a first-powerFET 514, which may correspond to a lowside powerFET in the output-stage of FIG. 4, $M_{PWR0}$, a second-powerFET 515, $M_{PWR1}$, comprising a source-terminal 516 and a drain-terminal 517, and a sense-resistor 509 connected in series between the source-terminal 516 and the reference-voltage-terminal 503. FIG. 5 also shows graphically a representation of drain-current, $I_D$, 518 from the voltage-output-terminal 504 to the voltage-reference-terminal 503.

Accordingly, the circuit 500 corresponds to a case where a powerFET is 'split-up' into a 'larger part' (i.e., the first-powerFET 514) and a 'smaller part' (i.e., the second-powerFET 515) that has a sense-resistor 509 in series with the source-terminal 516. Assuming that the resistance of the sense-resistor 509 is much smaller than the on-resistance of the second-powerFET 515, the drain current 518 distributes between the first- and second-powerFETs 514, 515 in two fractions with the same ratio as the sizes (for example of the channel widths) of the first- and second-powerFETs 514, 515.

Similar to the output-stage in FIG. 4, the sense-circuit 500 in FIG. 5 has one terminal of the sense-resistor 509 connected to ground. As such, the common-mode rejection requirement of a sense-amplifier (not shown in FIG. 5) is relaxed. This relaxation, however, is only true for lowside powerFETs that are connected to ground. For highside powerFETs the source is connected to the switching output node (compare to the first- and third-low-ohmic-powerFETS in the output-stage of FIG. 1), which can result in unacceptably high common-mode swings.

Figure 6:
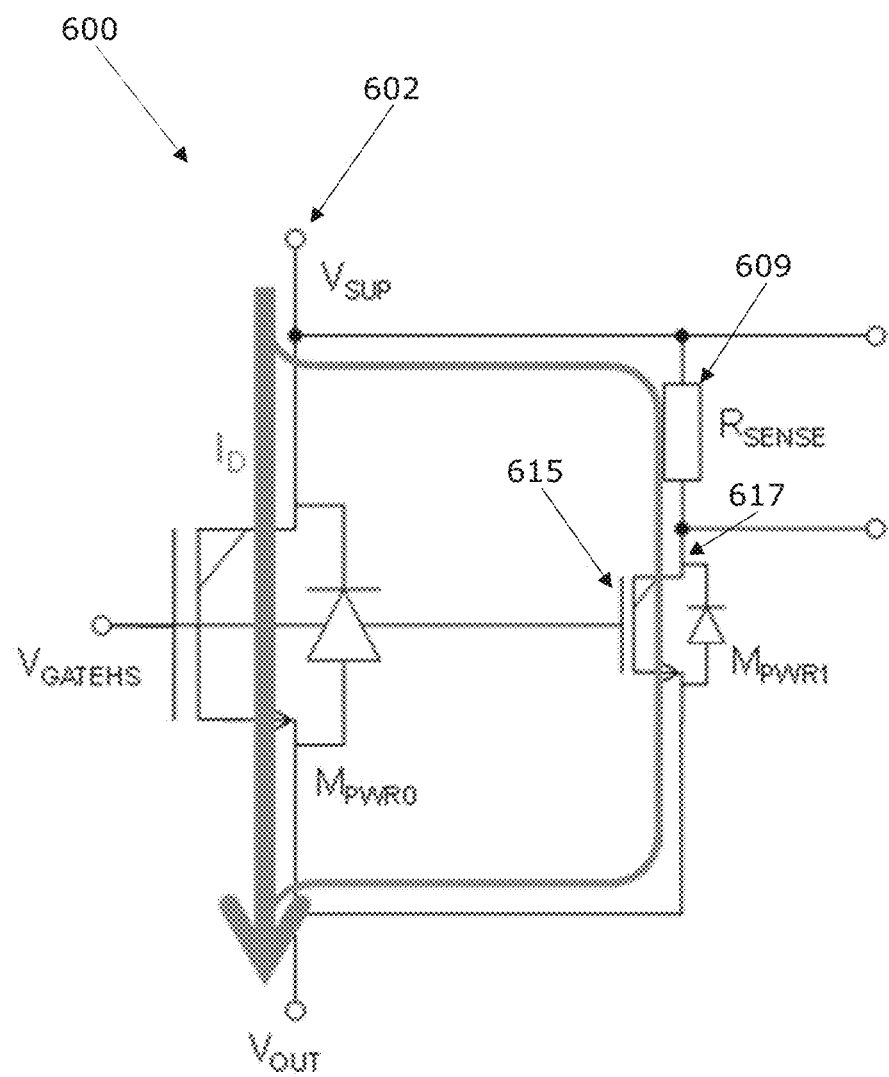
FIG. 6 shows a further example of a circuit.

FIG. 6 shows a further example of a circuit 600 that is similar to the circuit of FIG. 5. The circuit 600 comprises a reference-voltage-terminal 602 ($V_{SUP}$ in this example), a sense-resistor 609, and a second-powerFET 615 comprising a drain-terminal 617. Compared with the circuit of FIG. 5, the sense-resistor 609 of the circuit 600 of FIG. 6 is connected in series between the reference-voltage-terminal 602 and the drain-terminal 617. This configuration may address the problem of unacceptable common-mode swings described above.

For the distribution of the drain-current the sense-resistor can be placed in series with the source- or drain-terminal of a powerFET, so long as the resistance of the sense-resistor is small compared to the on-resistance of the 'smaller part' second-powerFET. Here, a design trade-off needs to be made: a smaller resistance of the sense-resistor improves linearity but yields a smaller signal which deteriorates the Signal-to-Noise ratio (SNR) of the system. For the highside powerFETs, note also that one terminal of the sense-resistor is connected to a static node, so no large common-mode swing is present.

Figure 7:
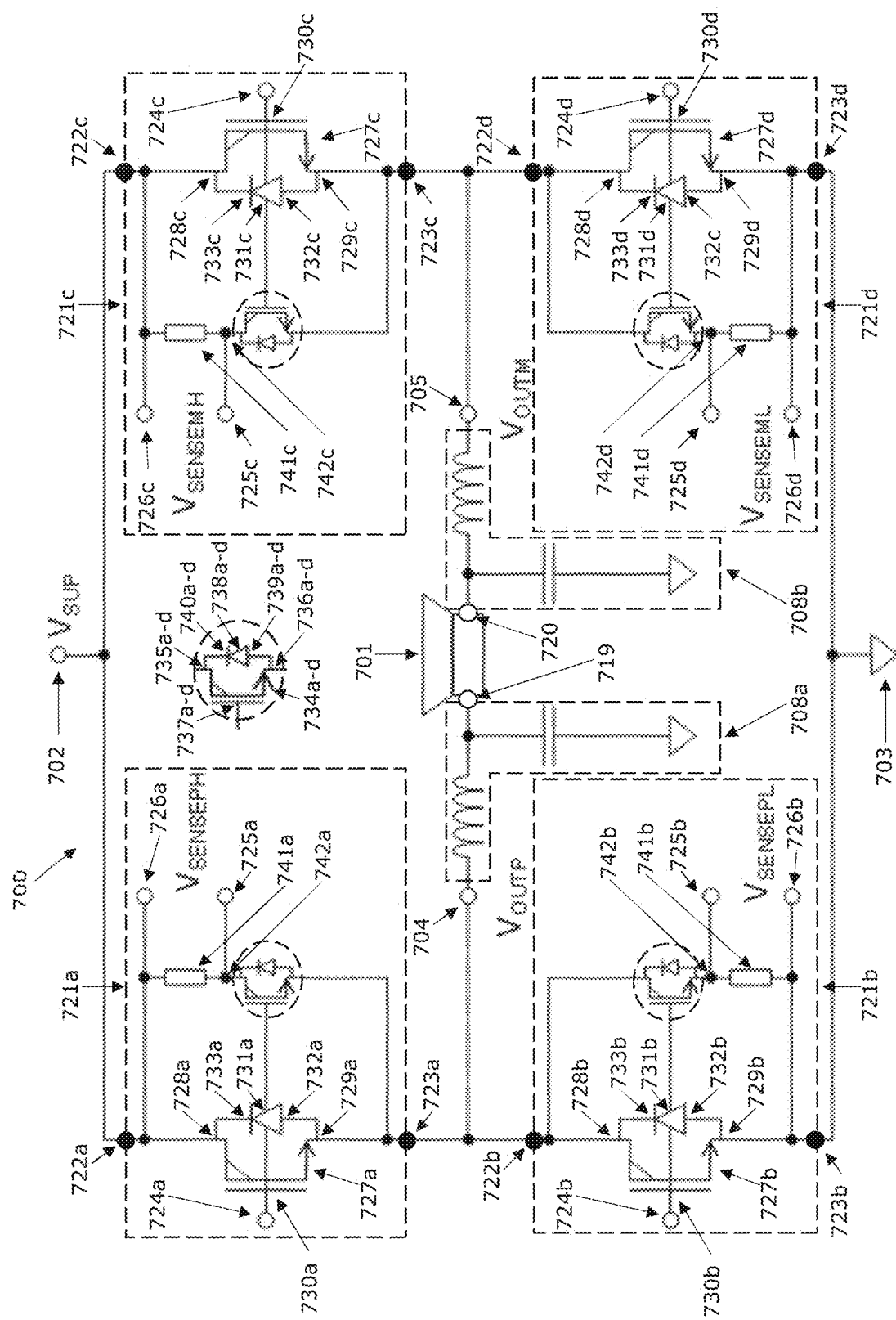
FIG. 7 shows an example embodiment of an output stage.

FIG. 7 shows an example embodiment of an output stage 700 that is based on the circuits of FIGS. 6 and 7. As such, the output stage 700 represents an alternative approach to current sensing than the approaches described with respect to the output stages shown in FIGS. 2-4.

The output stage 700 comprises an output-stage-first-reference-voltage-terminal (that receives a supply voltage, $V_{SUP}$, in this example) 702, an output-stage-second-reference-voltage-terminal (that corresponds to ground, GND, in this example) 703, an output-stage-first-output-voltage-terminal (that outputs a positive output voltage, $V_{OUTP}$, in this example) 704, and an output-stage-second-output-voltage-terminal (that outputs a negative output voltage, $V_{OUTM}$, in this example) 705. As will be discussed below, a loudspeaker 701 can be connected between the output-stage-first-output-voltage-terminal $V_{OUTP}$ 704 and the output-stage-second-output-voltage-terminal $V_{OUTM}$ 705

More specifically, the output stage 700 further comprises a first-output-device-terminal 719 for connecting to an output device, which in this example is the loudspeaker 701, and a second-output-device-terminal 720. The output stage 700 further comprises a first-low-pass-circuit 708*a* connected in series between the first-output-device-terminal 719 and the output-stage-first-output-voltage-terminal 704, and a second-low-pass-circuit 708*b* connected in series between the second-output-device-terminal 720 and the output-stage-second-output-voltage-terminal 705. The first- and second-low-pass circuits 708*a-b* may be provided as inductor-capacitor, LC, circuits, or resistor-capacitor, RC, circuits.

Although the output stage 700 is shown in FIG. 7 comprising the loudspeaker 701 connected to the first- and second-output-device-terminals 719, 720, it will be appreciated that other components/output devices can be used instead of the loudspeaker 701.

The output stage 700 further comprises first-, second-, third- and fourth-output-stage-amplification-blocks 721*a-d*.

Each output-stage-amplification-block 721a-d comprises an output-stage-amplification-block-input-node 722a-d, an output-stage-amplification-block-output-node 723a-d, an output-stage-amplification-block-control-terminal 724a-d, an output-stage-amplification-block-sense-terminal 725a-d. In this example each output-stage-amplification-block 721a-d also comprises an optional output-stage-amplification-block-reference-terminal 726a-d. As will become apparent from the description below, each output-stage-amplification-block-sense-terminal 725a-d facilitates fractional sensing of current through the output stage 700A.

Each output-stage-amplification-block 721a-d further comprises a first-output-stage-transistor 727a-d. The first-output-stage-transistors 727a-d comprise a first-output-stage-transistor-first-terminal 728a-d connected to the output-stage-amplification-block-input-node 722a-d, a first-output-stage-transistor-second-terminal 729a-d connected to the output-stage-amplification-block-output-node 723a-d, and a first-output-stage-transistor-control-terminal 730a-d connected to the output-stage-amplification-block-control-terminal 724a-d.

In some examples, the first-output-stage-transistor 727a-d is be a field-effect-transistor, FET, such as a metal-oxide semiconductor FET, MOSFET, or a powerFET, or a bipolar junction transistor or an insulated-gate bipolar transistor (IGBT). The MOSFET may be an n-type MOSFET or a p-type MOSFET.

Each output-stage-amplification-block 721a-d further comprises a first-output-stage-diode 731a-d comprising a first-output-stage-diode-anode 732a-d connected to first-output-stage-transistor-second-terminal 729a-d, and a first-output-stage-diode-cathode 732a-d connected to the first-output-stage-transistor-first-terminal 728a-d. In this example the first-output-stage-diodes 731a-d are body diodes of the associated first-output-stage-transistors 727a-d, such that the diodes are internal to the powerFET. The first-output-stage-diodes 731a-d can be included by lithographic construct of the device, and can be deliberately made to be significant so as to protect the first-output-stage-transistors 727a-d from damage against reverse recovery current during high frequency PWM switching. This can occur due to the inductor of the first- and second-low-pass-circuits 708a, 708b preceding the loudspeaker 701.

Each output-stage-amplification-block 721a-d further comprises a second-output-stage-transistor 734a-d—see inset of FIG. 7—connected in parallel with the first-output-stage-transistor 727a-d between the output-stage-amplification-block-input-node 722a-d and the output-stage-amplification-block-output-node 723a-d. Like the first-output-stage-transistor, the second-output-stage-transistor may be a FET, an n-type MOSFET, a p-type MOSFET, a powerFET or a bipolar junction transistor.

The second-output-stage-transistor 734a-d comprises a second-output-stage-transistor-first-terminal 735a-d connected to the output-stage-amplification-block-input-node 722a-d, a second-output-stage-transistor-second-terminal 736a-d connected to the output-stage-amplification-block-output-node 723a-d, and a second-output-stage-transistor-control-terminal 737a-d connected to the output-stage-amplification-block-control-terminal 724a-d.

Each output-stage-amplification-block 721a-d further comprises a second-output-stage-diode 738a-d—see inset of FIG. 7—comprising a second-output-stage-diode-anode 739a-d connected to the second-output-stage-transistor-second-terminal 736a-d, and a second-output-stage-diode-cathode 740a-d connected to the second-output-stage-transistor-first-terminal 735a-d. In this example the second-output-stage-diodes 738a-d are body diodes of the associated second-output-stage-transistors 734a-d Each output-stage-amplification-block 721a-d further comprises a sense-resistor 741a-d that is functionally related to the sense-resistors described with respect to the output stages of FIGS. 2-4. In the output stage 700 of FIG. 7, the sense-resistors 741a-d are connected between the output-stage-amplification-block-input-node 722a-d and the second-output-stage-transistor-first-terminal 735a-d, or between the output-stage-amplification-block-output-node 723a-d and the second-output-stage-transistor-second-terminal 736a-d of the corresponding output-stage-amplification-block 721a-d.

Each output-stage-amplification-block 721a-d further comprises a sense-node 742a-d in series between the sense-resistor 741a-d and the second-output-stage-transistor 734a-d and connected to the output-stage-amplification-block-sense-terminal 725a-d. The output stage 700 is further arranged as follows. The output-stage-amplification-block-input-nodes 722a, 722c of the first- and third-output-stage-amplification-blocks 721a, 721c are connected to the output-stage-first-reference-voltage-terminal 702.

The output-stage-amplification-block-output-nodes 723b, 723d of the second- and fourth-output-stage-amplification-blocks 721b, 721d are connected to the output-stage-second-reference-voltage-terminal 703. The output-stage-amplification-block-output-node 723a of the first-output-stage-amplification-block 721a and the output-stage-amplification-block-input-node 722b of the second-output-stage-amplification-block 721b are connected to the output-stage-first-output-voltage-terminal 704. The output-stage-amplification-block-output-node 723c of the third-output-stage-amplification-block 721c and the output-stage-amplification-block-input-node 722d of the fourth-output-stage-amplification-block are connected to the output-stage-second-output-voltage-terminal 705.

Thus, in some examples the output-stage 700 of FIG. 7 corresponds to a full BTL Class-D output stage with fractional current sensing resistors in highside and lowside powerFETs. The output-stage 700 may, therefore, yield four sense voltages $V_{SENSEPL}$, $V_{SENSEPH}$, $V_{SENSEML}$ and $V_{SENSEMH}$(respectively, from the output-stage-amplification-block-sense-terminals 725a-d of the first-, second, third- and fourth-amplification-blocks 721a-d). These four sense voltages can be combined into a single sense voltage, $V_{SENSE}$, that is proportional to the load and capacitor current:

$$V_{SENSE}=V_{SENSEPH}-V_{SENSEPL}-(V_{SENSEMH}-V_{SENSEML}) \quad (1)$$

Combining $V_{SENSEPL}$, $V_{SENSEPH}$, $V_{SENSEML}$ and $V_{SENSEMH}$ is challenging for two reasons. First, the highside sense voltages $V_{SENSEPH}$ and $V_{SENSEMH}$ refer to the supply voltage $V_{SUP}$ whereas the lowside sense voltages $V_{SENSEPL}$ and $V_{SENSEML}$ refer to ground. An ADC will typically also refer to ground, so the highside sense voltages need to be level-shifted to ground. Second, all sense voltages can be both positive and negative. This means that the lowside sense voltages $V_{SENSEPL}$ and $V_{SENSEML}$ can be below ground and the highside sense voltages $V_{SENSEPH}$ and $V_{SENSEMH}$ can be higher than the supply $V_{SUP}$.

Figure 8:
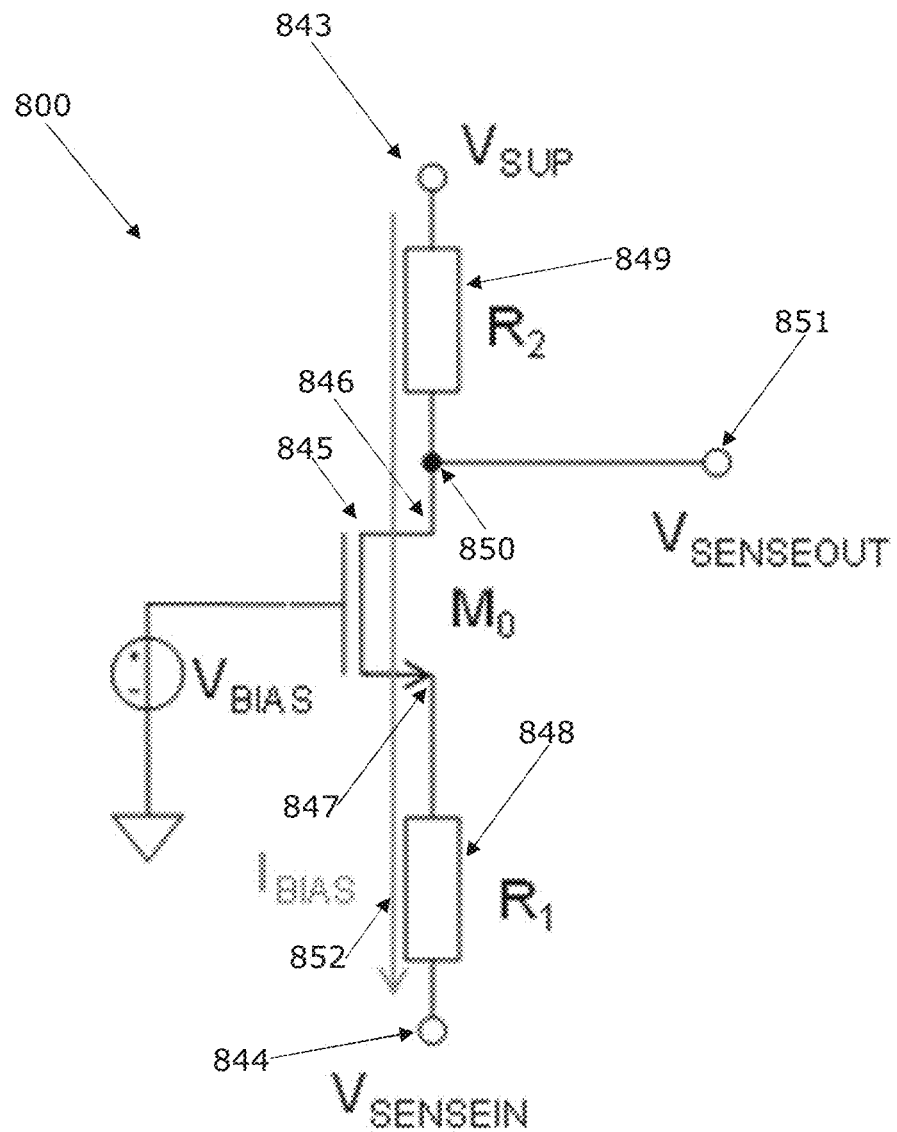
FIG. 8 shows an example of an amplifier.

FIG. 8 shows an example amplifier 800 that can address the second challenge. The amplifier 800 comprises a voltage-supply-node ($V_{SUP}$) 843, a sense-voltage-input-terminal ($V_{SENSEIN}$) 844, and a transistor 845. The transistor 845 comprises a first-conduction-channel-terminal 846 connected to the voltage-supply-node 843 and a second-conduction-channel-terminal 847 connected to the sense-voltage-input-node 844. The amplifier 800 further comprises a first-resistor ($R_1$) 848 connected in series between the sense-voltage-input-terminal 844 and the second-conduction-channel-terminal 847, a second-resistor ($R_2$) 849 connected in series between the voltage-supply-node 843 and the first-conduction-channel-terminal 846.

The amplifier further comprises a sense-node 850 provided between the first-conduction-channel-terminal 846 and the second-resistor 849, and a sense-voltage-output-terminal ($V_{SENSEOUT}$) 851 connected to the sense-node 850.

Also shown in FIG. 8 is a representation of bias-current, $I_{BIAS}$, 852, flowing from the voltage-supply-node 843 to the sense-voltage-input-terminal 844.

In an example, the amplifier 800 corresponds to a degenerated common-gate amplifier in which the transistor 845 is an n-type MOSFET, such that the first-conduction-channel-terminal 846 is a drain-terminal and the second-conduction-channel-terminal 847 is a source-terminal. In operation, an input signal can be applied at the degenerated source-terminal of the transistor 845 instead of at the control-terminal as in a common-source configuration. This allows the input signal to go below ground without any problems. Note, however, that the bias-current 852 is also flowing through the sense-voltage-input-terminal 844, which can result in a significant offset if the impedance of the signal source is high. A low source impedance, e.g. around 50 mΩ, may address this issue. The gain of the degenerated common-gate amplifier can be approximated as:

$$\frac{V_{SENSEOUT}}{V_{SENSEIN}} = \frac{R_2}{R_1} \cdot \frac{g_m R_1}{1 + g_m R_1} \quad (2)$$

where $g_m$ is the transconductance of the transistor 845.

Thus, a degenerated common-gate amplifier as described above can be used for both lowside sense signals $V_{SENSEPL}$ and $V_{SENSEML}$ to make the first part of the output voltage differential in equation 1. For the highside sense signals $V_{SENSEPH}$ and $V_{SENSEMH}$, a complementary version may be used; i.e., with a p-type MOSFET instead of an n-type MOSFET as the transistor and a bias voltage referring to the supply voltage $V_{SUP}$ instead of ground.

Figure 9:
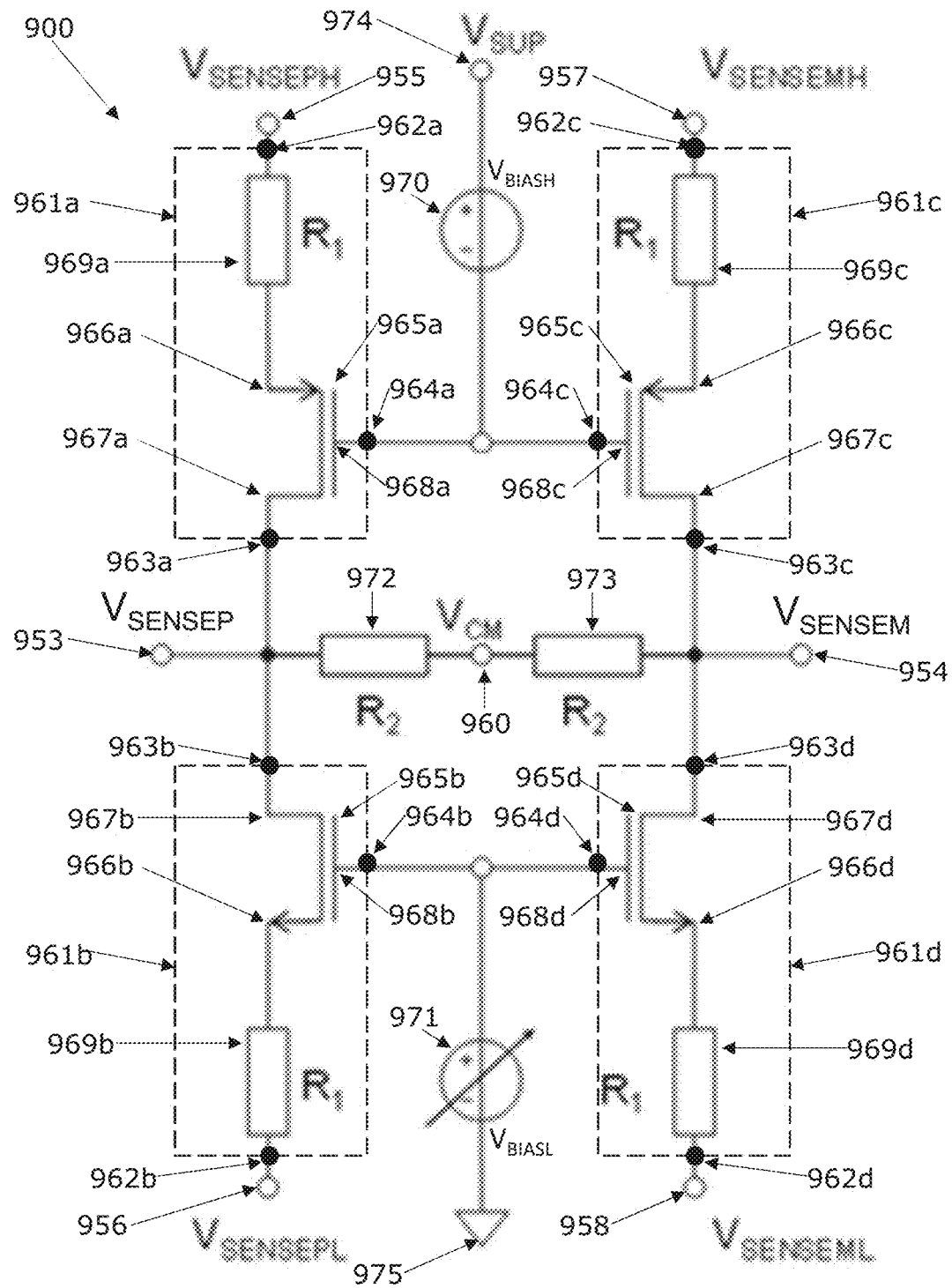
FIG. 9 shows an example embodiment of a sense amplifier circuit.

FIG. 9 shows an example embodiment of a sense amplifier circuit 900 that is based on the example amplifier of FIG. 8. The sense amplifier circuit 900 comprises a first-sensed-output-terminal ($V_{SENSEEM}$) 953, a second-sensed-output-terminal ($V_{SENSEEP}$) 954, a first-input-voltage-terminal ($V_{SENSEEM}$) 955, a second-input-voltage-terminal ($V_{SENSEPL}$) 956, a third-input-voltage-terminal ($V_{SENSEMH}$) 957, a fourth-input-voltage-terminal ($V_{SENSEML}$) 958, and a common-mode-voltage-node ($V_{CM}$) 960. By way of overview, the sense amplifier circuit 900 allows for a voltage signal at each input-voltage-terminal 955, 956, 957, 958 to be combined into a differential output voltage signal in accordance with equations (1) and (2). As such, the sense amplifier circuit 900 may be connected to the output stage of FIG. 7 to provide current sensing capability of current flow through the output stage.

The sense amplifier circuit 900 further comprises first-, second-, third- and fourth-amplification-blocks 961a-d. As shown, each amplification-block 961a-d comprises an amplification-block-input-node 962a-d, an amplification-block-output-node 963a-d and an amplification-block-control-node 964a-d.

Each amplification-block 961a-d further comprises an amplification-block-transistor 965a-d. Each amplification-block-transistor 965a-d comprises a first-conduction-channel-terminal 966a-d, a second-conduction-channel-terminal 967a-d that is connected to the amplification-block-output-node 963a-d, and a control-terminal 968a-d that is connected to the amplification-block-control-node 964a-d. An amplification-block-resistor ($R_1$) 969a-d is included in each amplification-block 961a-d and is connected in series between the amplification-block-input-node 962a-d and the first-conduction-channel-terminal 966a-d of the amplification-block-transistor 965a-d.

The sense amplifier circuit 900 further comprises a first-bias-voltage-source ($V_{BIASH}$) 970 connected to the amplification-block-control-nodes 964a, 964c of the first- and third-amplification-blocks 961a, 961c, and a second-bias-voltage-source ($V_{BIASL}$) 971 connected to the amplification-block-control-nodes 964b, 964d, of the second- and fourth-amplification-blocks 961b, 961d. The sense amplifier circuit further comprises a first-common-mode-voltage-resistor ($R_2$) 972 connected in series between the first-sensed-output-terminal 953 and the common-mode-voltage-node 960, and a second-common-mode-voltage-resistor ($R_2$) 973 connected in series between the second-sensed-output-terminal 954 and the common-mode-voltage-node 960.

The sense amplifier circuit 900 is further arranged as follows. The amplification-block-output-nodes 963a, 963b of the first- and second-amplification-blocks 961a, 961b are connected to the first-sensed-output-terminal 953. The amplification-block-output-nodes 963c, 963d of the third- and fourth-amplification-blocks 961c, 961d are connected to the second-sensed-output-terminal 954. The amplification-block-input-node 962a of the first-amplification-block 961a is connected to the first-input-voltage-terminal 955. The amplification-block-input-node 962b of the second-amplification-block 961b is connected to the second-input-voltage-terminal 956. The amplification-block-input-node 962c of the third-amplification-block 961c is connected to the third-input-voltage-terminal 957. The amplification-block-input-node 962d of the fourth-amplification-block 961d is connected to the fourth-input-voltage-terminal 958. The sense amplifier circuit 900 is configured such that bias currents can flow through the first- and second-amplification-blocks 961a, 961b and through the third- and fourth-amplification-blocks 961c, 961d (i.e., from top to bottom in FIG. 7). In addition, a signal current can flow through the first- and second-common-mode-voltage-resistors 972, 973.

In operation, a voltage level at the common-mode-voltage-node 960, which corresponds to a common-mode voltage level of output voltages at the first- and second-sensed-output-terminals 953, 954, can be regulated to any desired level by controlling the voltage level at the first-bias-voltage-source 970 and/or the second-bias-voltage-source 971. Accordingly, the sense amplifier circuit 900 can generate a differential output voltage—namely, a voltage at the second-sensed-output-terminal 954 minus a voltage at the first-sensed-output-terminal 953—that complies with equation (1) and has an additional gain factor given by equation (2).

In some examples the amplification-block-transistor 965a-d is bipolar-junction-transistor, BJT, or a field-effect-transistor, FET, examples of which are described above. For example, the amplification-block-transistors 965a, 965c of the first- and third-amplification-blocks 961a, 961c may be p-type metal-oxide-semiconductor FETs, MOSFETs, and the amplification-block-transistors 965b, 965d of the second- and fourth-amplification-blocks 961b, 961b may be n-type MOSFETs.

The sense amplifier circuit 900 of FIG. 9 also comprises a first-reference-voltage-terminal ($V_{SUP}$) 974 and a secondreference-voltage-terminal (GND) 975. The first-bias-voltage-source ($V_{BIASH}$) 970 is connected in series between: (i) the first-reference-voltage-terminal (VSUP) 974, and (ii) the amplification-block-control-nodes 964a, 964c of the first- and third-amplification-blocks 961a, 961c. The second-bias-voltage-source ($V_{BIASL}$) 971 is connected in series between: (i) the second-reference-voltage-terminal (GND) 975, and (ii) the amplification-block-control-nodes 964b, 964d, of the second- and fourth-amplification-blocks 961b, 961d.

Advantageously the sense amplifier circuit 900 shown in FIG. 9 provides a solution for how to combine four sense voltages into a single differential voltage. For example, both highside (e.g., when the amplification-block-transistors of the first- and third-amplification-blocks are p-type MOSFETs) and lowside (e.g., when the amplification-block-transistors of the second- and fourth-amplification-blocks are n-type MOSFETs) inputs can swing beyond the supply and ground respectively and the highside sense voltages are level-shifted to an appropriate output level without additional circuitry.

More generally, and as a further advantage, the sense amplifier circuit 900 shown in FIG. 9 can be integrated on-chip without the need of external components or additional pins, thereby making it compact. The sense amplifier circuit 900 shown in FIG. 9 may also allow for measurement of a load current though an output stage, for example the output stage described with respect to FIG. 7, with sufficient accuracy, potentially around 60 dB total harmonic distortion, with very limited overhead.

The sense amplifier circuit 900 may also be power efficient since the bias current from the highside part is shared by the lowside part. Also, because the sense amplifier circuit 900 is essentially a single stage amplifier, all bias currents serve to reduce the equivalent input noise and thus improve the SNR.

Referring again to equation (2), it will be appreciated that the gain of the sense amplifier depends on the transconductance $g_m$ of the transistor, making it temperature and process dependent.

Figure 10A:
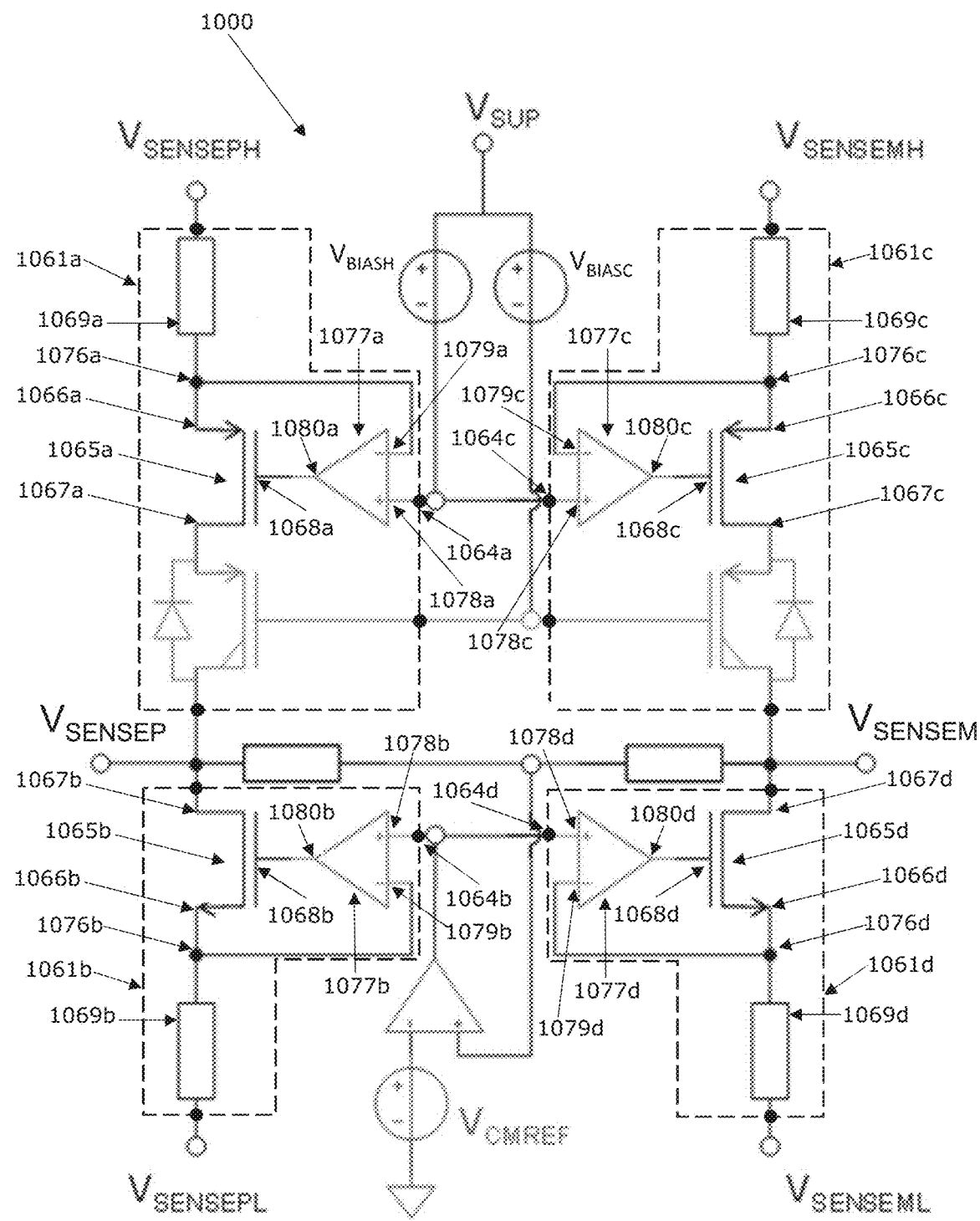
FIG. 10a shows a further example embodiment of a sense amplifier circuit.

FIG. 10a shows a further example embodiment of a sense amplifier circuit 1000. The sense amplifier circuit is similar to the sense amplifier circuit of FIG. 9 in that it comprises first-, second-, third- and fourth-amplification-blocks 1061a-d. As before, each amplification-block 1061a-d comprises an amplification-block-control-node 1064a-d, an amplification-block-resistor ($R_1$) 1069a-d, and an amplification-block-transistor 1065a-d comprising a first-conduction-channel-terminal 1066a-d, a second-conduction-channel-terminal 1067a-d, and a control-terminal 1068a-d. Unless the following description otherwise makes clear, the sense amplifier circuit 1000 of FIG. can be taken to comprise the same features as the sense amplifier circuit of FIG. 9 and their corresponding functions.

Differences over the sense amplifier circuit of FIG. 9 include a connection-node 1076a-d connected in series between the amplification-block-resistor 1069a-d and the first-conduction-channel-terminal 1066a-d, and an amplifier 1077a-d comprising an amplifier-first-input-terminal 1078a-d, an amplifier-second-input-terminal 1079a-d, and an amplifier-output-terminal 1080a-d. Here, the amplifier-first-input-terminal 1078a-d is connected to the amplification-block-control-node 1064a-d, the amplifier-second-input-terminal 1079a-d is connected to the connection-node 1076a-d and the amplifier-output-terminal 1080a-d is connected to the control-terminal 1068a-d. Accordingly, the control-terminal 1068a-d is connected indirectly to the amplification-block-control-node 1064a-d through the amplifier 1077a-d.

The introduction of an amplifier 1077a-d to each amplification-block 1064a-d may reduce the dependency of $g_m$ to temperature and transistor processing. This is because the amplifiers 1077a-d act as $g_m$-boosting feedback loops around the amplification-block-transistors 1065a-d. As a result, the $g_m$ of the amplification-block-transistors 1065a-d is multiplied by the gain of the amplifiers 1077a-d in the loop. The effective gm consequently becomes so large that the gain converges to the ratio of the common-mode-voltage-resistors to the amplification-block-resistors (that is, to $R_2/R_1$ in equation 2) and so becomes independent on transistor processing and temperature. As such, the noise performance of the sense amplifier circuit is primarily determined by the amplifiers and beneficially is less dependent on the bias current flowing through the sense amplifier circuit core.

Referring back to the example applications of output stages, a characteristic of automotive amplifiers is that they are typically realized using high-voltage (HV) technologies that feature devices capable of handling high voltages, e.g. more than 60V, as well as standard CMOS devices. Standard CMOS devices are best suited for signal processing functions because they give the highest gm for a certain current/area budget. For the lowside part of a sense amplifier, standard thin-oxide CMOS devices may therefore be appropriate since the input signals are around ground level and the outputs are at low voltage levels in order to match the common-mode input range of a (low-voltage) ADC. The highside part of the sense amplifier is essentially a complementary version of the lowside, albeit referring to a supply voltage rather than to ground, so it can also be realized with thin-oxide CMOS. Because the highside outputs refer to ground and not to supply, however, a large voltage difference will appear across the drain and source of the highside PMOS devices.

Figure 10B:
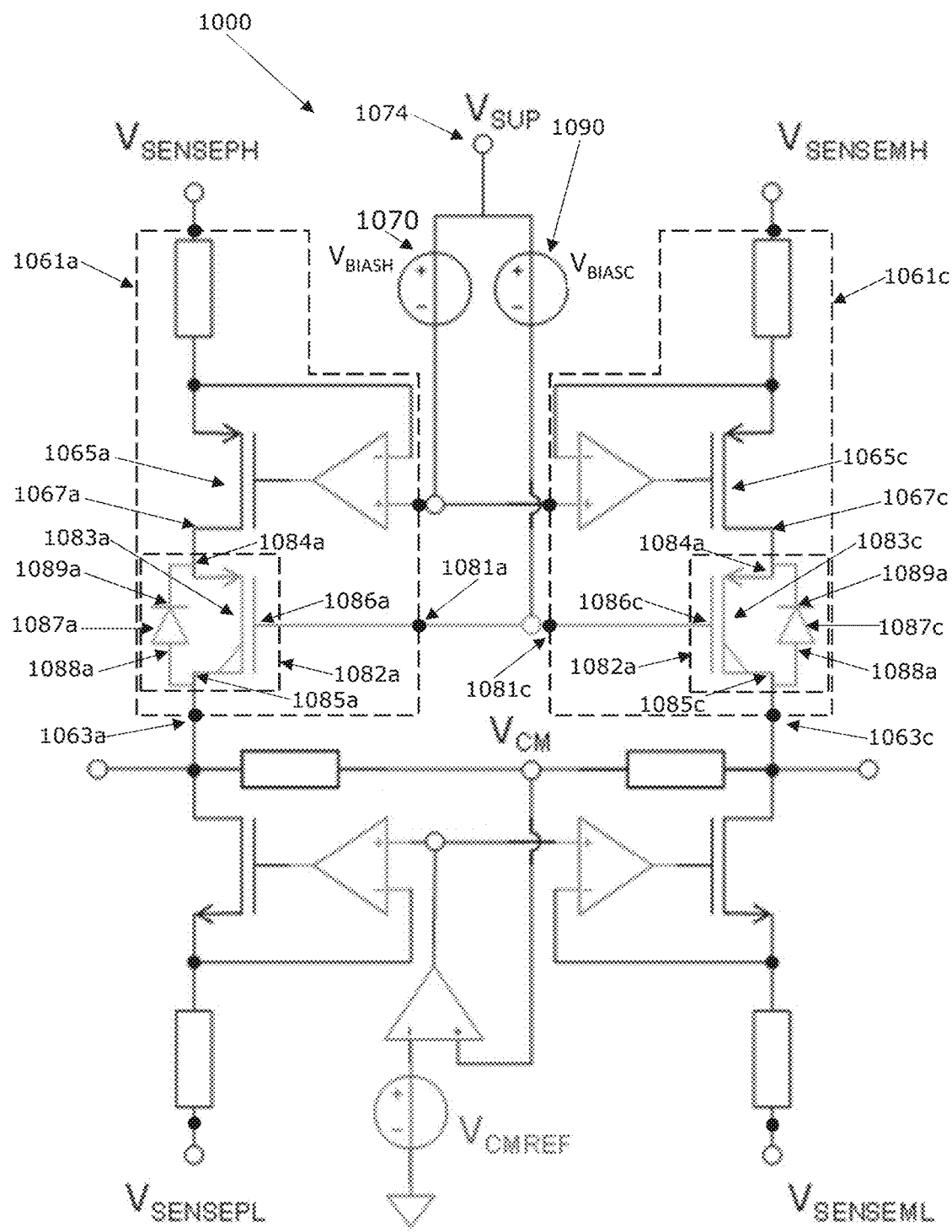

FIG. 10b shows further features of the sense amplifier circuit 1000 that can address the above problem, features that may be provided in combination with or as an alternative to the features described with reference to FIG. 10a. Specifically, the first and third-amplification-blocks 1061a, 1061c comprise an amplification-block-output-node 1063a, 1063c, and amplification-block-cascode-control-node 1081a, 1081c, a transistor 1065a, 1065c comprising a second-conduction-channel-terminal 1067a, 1067c, and a cascode 1082a, 1082c connected in series between the second-conduction-channel-terminal 1067a, 1067c and the amplification-block-output-node 1063a, 1063c.

The cascodes 1082a, 1082c (which can be high voltage cascodes) can make it possible to isolate the high and low-side circuitry, so they can advantageously be built with smaller devices and process small signals separately at different voltage levels.

Each cascode 1082a, 1082c comprises a cascode-transistor 1083a, 1083c. The cascode-transistor 1083a, 1083c comprises a cascode-transistor-first-conduction-channel-terminal 1084a, 1084c connected to the second-conduction-channel-terminal 1067a, 1067c, a cascode-transistor-second-conduction-channel-terminal 1085a, 1085c connected to the amplification-block-output-node 1063a, 1063c, and a cascode-transistor-control-terminal 1086a, 1086c connected to the amplification-block-cascode-control-node 1081a, 1081c.

In some examples, each cascode-transistor 1083a, 1083c is a MOSFET; for example, a p-type MOSFET.

Each cascode 1082a, 1082c further comprises a cascode-diode 1087a, 1087c comprising a cascode-diode-anode 1088a, 1088c connected to the cascode-transistor-secondconduction-channel-terminal 1085*a*, 1085*c*, and a cascode-diode-cathode 1089*a*, 1089*c* connected to the cascode-transistor-first-conduction-channel-terminal 1084*a*, 1084*c*.

The sense amplifier circuit 1000 further comprises a first-bias-voltage-source 1070—compare to the first-bias-voltage-source of the sense amplifier circuit of FIG. 9—and a third-bias-voltage-source ($V_{BIASC}$) 1090 connected to the amplification-block-cascode-control-node 1081*a*, 1081*c* of the first- and third-amplification-blocks 1061*a*, 1061*c*. In some examples, the sense amplifier circuit 1000 comprises a first-reference-voltage-terminal 1074—compare to the first-reference-voltage-terminal of the sense amplifier circuit of FIG. 9. In these examples, the third-bias-voltage-source 1090 is connected to the first-reference-voltage-terminal 1074.

In an example, each cascode-transistor may be a high-voltage, HV, PMOS transistor. During operation, the gates of these HV-PMOS transistors are biased with a voltage from the third-bias-voltage-source 1090 that is slightly lower than a voltage from the first-bias-voltage-source 1070 and also refers to the first-reference-voltage-terminal 1074. As such, the drain voltages of the PMOS transistors are beneficially shielded from high voltages.

As discussed above, the outputs of a sense amplifier circuit should match the common-mode input range of a low-voltage ADC for more accurate operation.

Figure 10C:
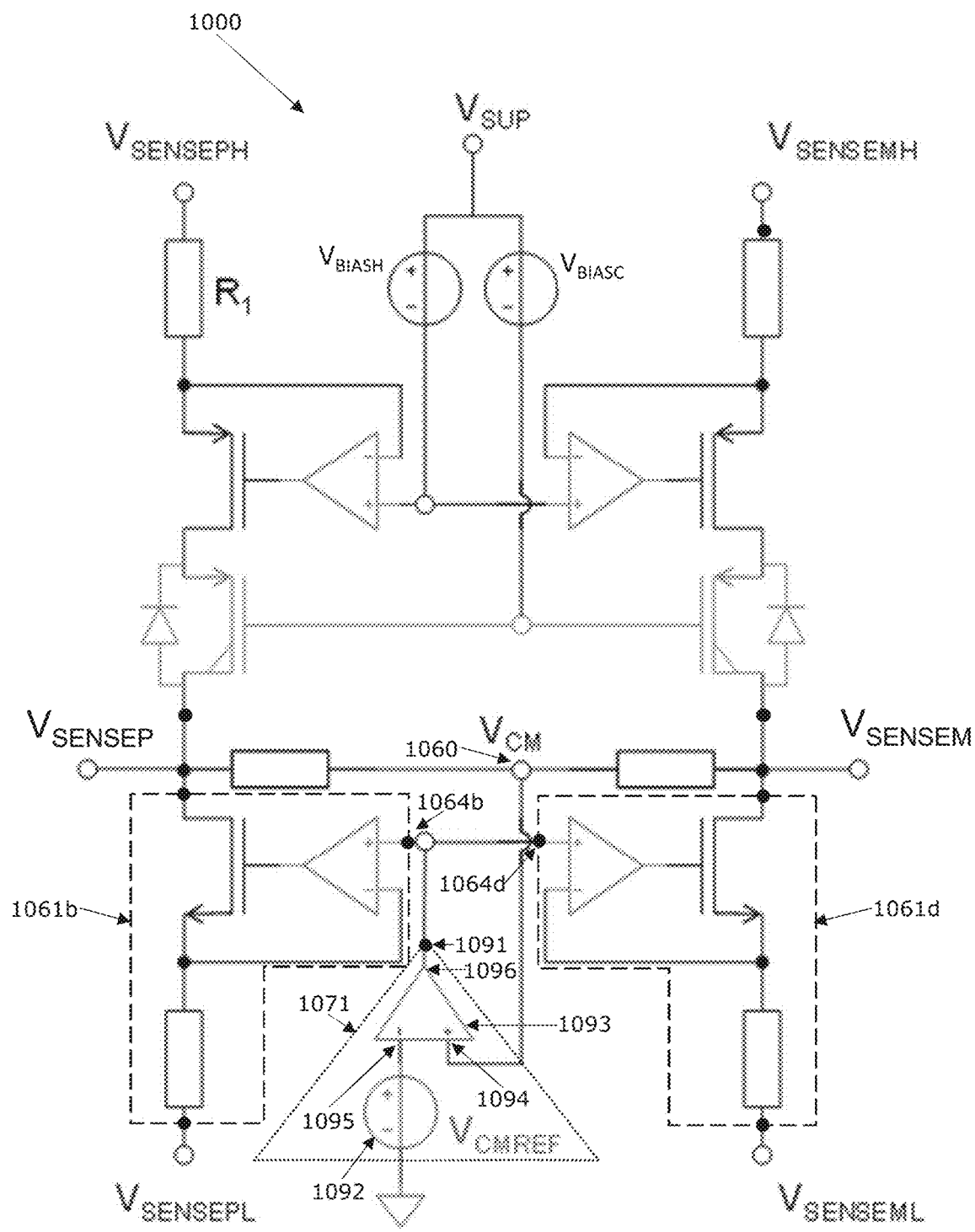

FIG. 10*c* shows further features of the sense amplifier circuit 1000 that can address the above issue, features that may be provided in combination with or as an alternative to the features described with reference to FIGS. 10*a* and 10*b*. Specifically, the sense amplifier circuit 1000 comprises a second-bias-voltage-source ($V_{BIASL}$) 1071 comprising a second-bias-voltage-source-output-node 1091 connected to the amplification-block-control-nodes 1064*b*, 1064*d* of the second- and fourth-amplification-blocks 1061*b*, 1061*d*, a third-bias-voltage-source ($V_{CMREF}$) 1092, and a fifth-amplifier 1093. The fifth amplifier 1093 comprises an amplifier-first-input-terminal 1094 connected to the common-mode-voltage-node ($V_{CM}$) 1060, an amplifier-second-input-terminal 1095 connected to the third-bias-voltage-source ($V_{CMREF}$) 1092, and an amplifier-output-terminal 1096 connected to the second-bias-voltage-source-output-node 1091.

In operation, a common-mode level at the common-mode-voltage-node 1060 can be regulated to a reference voltage level provided by the third-bias-voltage-source 1092 with a common-mode feedback loop provided by the fifth amplifier 1093. This loop senses the common-mode level at the common-mode-voltage-node 1060 and compares the common-mode level to the reference voltage level, the output of which corresponds to the output of the second-bias-voltage-source ($V_{BIASL}$) 1071.

In some examples, the sense amplifier circuit of FIG. 9, 10*a*, 10*b*, or 10*c* is connected to the output stage of FIG. 7. In such examples, each input-voltage-terminal has a corresponding output-stage-amplification-block-sense-terminal. That is, the first-input-voltage-terminal is connected to the output-stage-amplification-block-sense-terminal of the first-output-stage-amplification-block, the second-input-voltage-terminal is connected to the output-stage-amplification-block-sense-terminal of the second-output-stage-amplification-block, the third-input-voltage-terminal is connected to the output-stage-amplification-block-sense-terminal of the third-output-stage-amplification-block, and the fourth-input-voltage-terminal is connected to the output-stage-amplification-block-sense-terminal of the fourth-output-stage-amplification-block. In other examples, the sense amplifier circuit of FIG. 9, 10*a*, 10*b*, or 10*c* can be connected to any output stage that has an H-bridge mode, such as for a DC Motor.

The sense amplifier circuit can also be used with segmented power stages. In some examples, the output stage comprises very low-ohmic sense-resistors (such as the sense-resistor 741*a-d* in FIG. 7), which can be of the order of 10 mΩ, 50 mΩ 60 mΩ, or 100 mΩ, as non-limiting examples. As discussed above, this can be much smaller than the on-resistance of the associated second-output-stage-transistors 734*a-d* in FIG. 7. The on-resistance of the associated second-output-stage-transistors 734*a-d* may be of the order of 100 mΩ, 250 mΩ, 500 mΩ, or 1Ω, as non-limiting examples. The ratio between the first- and second-output-stage-transistors can be in the range of 15:1. As a result, good matching between the sense voltages can be achieved. Also, the low impedance of the sense voltages makes them insensitive to disturbances. Consequently, the location of a sense amplifier circuit (e.g., the sense amplifier circuit shown in FIG. 10) in the floorplan of the output-stage is not critical.

The connection of a sense amplifier circuit as described with reference to FIGS. 9 and 10*a-c* to the output-stage of FIG. 7 may afford one or more of the advantages set out above.

It will be appreciated that any components that are described or illustrated herein as being coupled or connected could be directly or indirectly coupled or galvanically connected. That is, one or more components could be located between two components that are said to be coupled or connected whilst still enabling the required functionality to be achieved.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A sense amplifier circuit comprising:
a first-sensed-output-terminal;
a second-sensed-output-terminal;
a first-input-voltage-terminal;
a second-input-voltage-terminal;
a third-input-voltage-terminal;
a fourth-input-voltage-terminal;
a common-mode-voltage-node;
first-, second-, third- and fourth-amplification-blocks, each amplification-block comprising:
an amplification-block-input-node,
an amplification-block-output-node,
an amplification-block-control-node,
an amplification-block-transistor comprising:
a first-conduction-channel-terminal,
a second-conduction-channel-terminal that is connected to the amplification-block-output-node, and
a control-terminal that is connected to the amplification-block-control-node;
an amplification-block-resistor connected in series between the amplification-block-input-node and the first-conduction-channel-terminal,
a first-bias-voltage-source connected to the amplification-block-control-nodes of the first- and third-amplification-blocks;
a second-bias-voltage-source connected to the amplification-block-control-nodes of the second- and fourth-amplification-blocks;
a first-common-mode-voltage-resistor connected in series between the first-sensed-output-terminal and the common-mode-voltage-node; and
a second-common-mode-voltage-resistor connected in series between the second-sensed-output-terminal and the common-mode-voltage-node,
wherein:
the amplification-block-output-nodes of the first- and second-amplification-blocks are connected to the first-sensed-output-terminal;
the amplification-block-output-nodes of the third- and fourth-amplification-blocks are connected to the second-sensed-output-terminal;
the amplification-block-input-node of the first-amplification-block is connected to the first-input-voltage-terminal;
the amplification-block-input-node of the second-amplification-block is connected to the second-input-voltage-terminal;
the amplification-block-input-node of the third-amplification-block is connected to the third-input-voltage-terminal; and
the amplification-block-input-node of the fourth-amplification-block is connected to the fourth-input-voltage-terminal.

2. The sense amplifier circuit of claim 1, wherein each amplification-block-transistor is a bipolar-junction-transistor, BJT, or a field-effect-transistor, FET.

3. The sense amplifier circuit of claim 1, wherein the transistors of the first- and third-amplification-blocks are p-type metal-oxide-semiconductor FETs, MOSFETs, and the transistors of the second- and fourth-amplification-blocks are n-type MOSFETs.

4. The sense amplifier circuit of claim 1, comprising a first-reference-voltage-terminal connected to the first-bias-voltage-source, and a second-reference-voltage-terminal connected to the second-bias-voltage-source.

5. The sense amplifier circuit of claim 1, wherein each amplification-block comprises:
a connection-node connected in series between the amplification-block-resistor and the first-conduction-channel-terminal;
an amplifier comprising:
an amplifier-first-input-terminal;
an amplifier-second-input-terminal; and
an amplifier-output-terminal,
wherein:
the amplifier-first-input-terminal is connected to the amplification-block-control-node;
the amplifier-second-input-terminal is connected to the connection-node; and
the amplifier-output-terminal is connected to the control-terminal, such that the control-terminal is connected to the amplification-block-control-node via the amplifier.

6. The sense amplifier circuit of claim 1, wherein the first and third-amplification-blocks comprise:
an amplification-block-cascode-control-node; and
a cascode connected in series between the second-conduction-channel-terminal and the amplification-block-output-node, the cascode comprising:
a cascode-transistor comprising:
a cascode-transistor-first-conduction-channel-terminal connected to the second-conduction-channel-terminal,
a cascode-transistor-second-conduction-channel-terminal connected to the amplification-block-output-node, and
a cascode-transistor-control-terminal connected to the amplification-block-cascode-control-node, and
a cascode-diode comprising:
a cascode-diode-anode connected to the cascode-transistor-second-conduction-channel-terminal, and
a cascode-diode-cathode connected to the cascode-transistor-first-conduction-channel-terminal.

7. The sense amplifier circuit of claim 6, wherein the sense amplifier circuit comprises a third-bias-voltage-source connected to the amplification-block-cascode-control-node of the first- and third-amplification-blocks.

8. The sense amplifier circuit of claim 6, wherein each cascode-transistor is a p-type MOSFET.

9. The sense amplifier circuit of claim 7, wherein the third-bias-voltage-source is connected to the first-reference-voltage-terminal.

10. The sense amplifier circuit of claim 1, wherein the second-bias-voltage-source comprises:
 a second-bias-voltage-source-output-node connected to the amplification-block-control-nodes of the second- and fourth-amplification-blocks;
 a third-bias-voltage-source;
 a fifth-amplifier comprising:
  an amplifier-first-input-terminal connected to the common-mode-voltage-node;
  an amplifier-second-input-terminal connected to the third-bias-voltage-source; and
  an amplifier-output-terminal connected to the second-bias-voltage-source-output-node.

11. An output stage comprising:
 the sense amplifier circuit of claim 1,
 an output-stage-first-reference-voltage-terminal;
 an output-stage-second-reference-voltage-terminal;
 an output-stage-first-output-voltage-terminal;
 an output-stage-second-output-voltage-terminal;
 a first-output-device-terminal;
 a second-output-device-terminal;
 a first-low-pass-circuit connected in series between the first-output-device-terminal and the output-stage-first-output-voltage-terminal;
 a second-low-pass-circuit connected in series between the second-output-device-terminal and the output-stage-second-output-voltage-terminal;
 first-, second-, third- and fourth-output-stage-amplification-blocks, each output-stage-amplification-block comprising:
  an output-stage-amplification-block-input-node,
  an output-stage-amplification-block-output-node,
  an output-stage-amplification-block-control-terminal,
  an output-stage-amplification-block-sense-terminal,
  a first-output-stage-transistor comprising:
   a first-output-stage-transistor-first-terminal connected to the output-stage-amplification-block-input-node,
   a first-output-stage-transistor-second-terminal connected to the output-stage-amplification-block-output-node, and
   a first-output-stage-transistor-control-terminal connected to the output-stage-amplification-block-control-terminal,
  a first-output-stage-diode comprising:
   a first-output-stage-diode-anode connected to the first-output-stage-transistor-second-terminal, and
   a first-output-stage-diode-cathode connected to the first-output-stage-transistor-first-terminal,
  a second-output-stage-transistor connected in parallel with the first-output-stage-transistor between the output-stage-amplification-block-input-node and the output-stage-amplification-block-output-node, the second-output-stage-transistor comprising:
   a second-output-stage-transistor-first-terminal connected to the output-stage-amplification-block-input-node,
   a second-output-stage-transistor-second-terminal connected to the output-stage-amplification-block-output-node, and
   a second-output-stage-transistor-control-terminal connected to the output-stage-amplification-block-control-terminal,
  a second-output-stage-diode comprising:
   a second-output-stage-diode-anode connected to the second-output-stage-transistor-second-terminal, and
   a second-output-stage-diode-cathode connected to the second-output-stage-transistor-first-terminal,
  a sense-resistor connected between:
   the output-stage-amplification-block-input-node and the second-output-stage-transistor-first-terminal, or
   between the output-stage-amplification-block-output-node and the second-output-stage-transistor-second-terminal, and
  a sense-node in series between the sense-resistor and the second-output-stage-transistor and connected to the output-stage-amplification-block-sense-terminal; and
 wherein:
  the output-stage-amplification-block-input-nodes of the first- and third-output-stage-amplification-blocks are connected to the output-stage-first-reference-voltage-terminal;
  the output-stage-amplification-block-output-nodes of the second- and fourth-output-stage-amplification-blocks are connected to the output-stage-second-reference-voltage-terminal;
  the output-stage-amplification-block-output-node of the first-output-stage-amplification-block and the output-stage-amplification-block-input-node of the second-output-stage-amplification-block are connected to the output-stage-first-output-voltage-terminal;
  the output-stage-amplification-block-output-node of the third-output-stage-amplification-block and the output-stage-amplification-block-input-node of the fourth-output-stage-amplification-block are connected to the output-stage-second-output-voltage-terminal;
  the first-input-voltage-terminal is connected to the output-stage-amplification-block-sense-terminal of the first-output-stage-amplification-block;
  the second-input-voltage-terminal is connected to the output-stage-amplification-block-sense-terminal of the second-output-stage-amplification-block;
  the third-input-voltage-terminal is connected to the output-stage-amplification-block-sense-terminal of the third-output-stage-amplification-block; and
  the fourth-input-voltage-terminal is connected to the output-stage-amplification-block-sense-terminal of the fourth-output-stage-amplification-block.

12. The output stage of claim 11, comprising a loudspeaker connected to the first- and second-output-device-terminals.

13. The output stage of claim 11, wherein the first-low-pass-filter and the second-low-pass-filter comprise an inductor-capacitor, LC, circuit.

14. The output stage of claim 11, wherein each first-output-stage-transistor and each second-output-stage-transistor is a field-effect-transistor, FET.

15. The output stage of claim 11, wherein:
 the first-output-stage-diodes are body diodes of their associated first-output-stage-transistors, and/or the second-output-stage-diodes are body diodes of their associated second-output-stage-transistors.

16. A sense amplifier circuit comprising:
a first amplification block having a first input coupled to receive a first input voltage signal, a first control input, and a first output;
a second amplification block having a second input coupled to receive a second input voltage signal, a second control input, and a second output, the second output connected to the first output at a first sensed output terminal;
a first bias voltage source having a first terminal coupled to a first voltage supply node and a second terminal coupled to the first control input; and
a second bias voltage source having a first terminal coupled to a second voltage supply node and a second terminal coupled to the second control input, wherein the first amplification block comprises:
a transistor having a control terminal coupled to the first control input and a first conduction channel terminal coupled to the first output; and
a resistor having a first terminal coupled to a second conduction channel terminal of the transistor and a second terminal coupled to the first input.

17. The sense amplifier circuit of claim 16, wherein the control terminal of the transistor is coupled to the first control input through an amplifier, the amplifier having an output connected to the control terminal of the transistor and an input connected to the first control input.

18. The sense amplifier circuit of claim 16, wherein the second amplification block comprises:
an amplifier having a first input connected to the second control input, a second input, and an output;
a transistor having a control terminal connected to the output of the amplifier, a first conduction channel terminal connected to the second output, and a second conduction channel terminal connected to the second input of the amplifier; and
a resistor having a first terminal connected to the second conduction channel terminal of the transistor and a second terminal coupled to the second input.

19. The sense amplifier circuit of claim 16, further comprising:
a third amplification block having a third input coupled to receive a third input voltage signal, a third control input coupled to the second terminal of the first bias voltage source, and a third output;
a fourth amplification block having a fourth input coupled to receive a fourth input voltage signal, a fourth control input coupled to the second terminal of the second bias voltage source, and a fourth output, the fourth output connected to the second output at a second sensed output terminal;
a first resistor having a first terminal coupled to the first sensed output terminal and a second terminal connected to a common mode voltage node; and
a second resistor having a first terminal coupled to the second sensed output terminal and a second terminal connected to the common mode voltage node.

\* \* \* \* \*